(12) United States Patent
Komiyama

(10) Patent No.: US 10,352,970 B2
(45) Date of Patent: *Jul. 16, 2019

(54) DETECTION APPARATUS, POWER RECEIVING APPARATUS, NON-CONTACT POWER TRANSMISSION SYSTEM AND DETECTION METHOD

(71) Applicant: Sony Corporation, Tokyo (JP)

(72) Inventor: Shinji Komiyama, Saitama (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/023,315

(22) Filed: Jun. 29, 2018

(65) Prior Publication Data

US 2018/0321280 A1    Nov. 8, 2018

Related U.S. Application Data

(63) Continuation of application No. 15/271,852, filed on Sep. 21, 2016, now Pat. No. 10,036,767, which is a
(Continued)

(51) Int. Cl.
*G01R 15/18* (2006.01)
*G01R 21/00* (2006.01)
(Continued)

(52) U.S. Cl.
CPC ............ *G01R 15/18* (2013.01); *G01R 21/006* (2013.01); *G01V 3/10* (2013.01); *G06F 17/00* (2013.01);
(Continued)

(58) Field of Classification Search
CPC ... G01R 15/181; G01R 15/183; G01R 15/186
(Continued)

(56) References Cited

U.S. PATENT DOCUMENTS 3,163,818 A    12/1964  Spaven
4,536,709 A     8/1985  Ishida
(Continued)

FOREIGN PATENT DOCUMENTS

JP    48-008581    2/1973
JP    52-021873    2/1977
(Continued)

OTHER PUBLICATIONS

Japanese Patent Office Action dated Sep. 1, 2015 issued in corresponding Japanese Patent Application No. JP 2011-280059 with English translation.
(Continued)

*Primary Examiner* — Dharti H Patel
(74) *Attorney, Agent, or Firm* — Dentons US LLP

(57) ABSTRACT

Disclosed herein is a detection apparatus including: a resonant circuit provided with a Q-factor measurement coil and one or more capacitors to serve as a circuit for receiving pulses; a response-waveform detecting section configured to detect the waveform of a response output by the resonant circuit in response to the pulses; and a Q-factor measuring section configured to measure a Q factor of the resonant circuit from the response waveform detected by the response-waveform detecting section. It is possible to increase the precision of detection of a metallic foreign substance existing between a power transmitting side and a power receiving side.

21 Claims, 8 Drawing Sheets

Related U.S. Application Data continuation of application No. 13/689,100, filed on Nov. 29, 2012, now Pat. No. 9,482,702.

(51) Int. Cl.
| | |
|---|---|
| *G06F 17/00* | (2019.01) |
| *G01V 3/10* | (2006.01) |
| *H02J 4/00* | (2006.01) |
| *H02J 7/02* | (2016.01) |
| *H02J 50/12* | (2016.01) |
| *H02J 50/60* | (2016.01) |
| *H02J 50/80* | (2016.01) |
| *H02J 5/00* | (2016.01) |

(52) U.S. Cl.
CPC .............. *H02J 4/00* (2013.01); *H02J 7/025* (2013.01); *H02J 50/12* (2016.02); *H02J 50/60* (2016.02); *H02J 50/80* (2016.02); *H02J 5/005* (2013.01)

(58) Field of Classification Search
USPC ........................................ 307/104; 324/127
See application file for complete search history.

(56) References Cited

U.S. PATENT DOCUMENTS

| | | | |
|---|---|---|---|
| 4,843,259 A | 6/1989 | Weisshaupt | |
| 5,019,782 A | 5/1991 | Schatter | |
| 10,036,767 B2 * | 7/2018 | Komiyama | ............ G01R 15/18 |
| 2002/0041458 A1 | 4/2002 | Kobayashi et al. | |
| 2004/0056778 A1 | 3/2004 | Hilliard | |
| 2007/0241762 A1 | 10/2007 | Varpula et al. | |
| 2009/0015250 A1 | 1/2009 | Sunier et al. | |
| 2010/0199765 A1 | 8/2010 | Retz | |
| 2011/0128015 A1 | 6/2011 | Hariharakumaran | |
| 2011/0241437 A1 | 10/2011 | Kanno | |

FOREIGN PATENT DOCUMENTS

| | | |
|---|---|---|
| JP | 57-135348 | 8/1982 |
| JP | S5885848 | 5/1983 |
| JP | 63-134965 | 6/1988 |
| JP | H08-094687 | 4/1996 |
| JP | H08-0322252 | 12/1996 |
| JP | 2000-134830 | 5/2000 |
| JP | 2001-275280 | 10/2001 |
| JP | 2008-206321 | 9/2008 |
| JP | 2010-164472 | 7/2010 |
| JP | 2010-213414 | 9/2010 |
| JP | 2010-239816 | 10/2010 |
| JP | 2011-229360 | 11/2011 |
| WO | WO/2011/010375 | 1/2011 |

OTHER PUBLICATIONS

Chinese Patent Office Action from corresponding Chinese Patent Application No. 2012105355082 dated Nov. 16, 2017.
Japanese Office Action from corresponding Japanese Patent Application No. 2016-204034 dated Dec. 12, 2017.
Japanese Office Action from corresponding Japanese Patent Application No. 2016-204034 dated Aug. 1, 2017.
Hoshino Masaru: Detecting device of metalic piece foreign matter: Abstract drawings.

* cited by examiner

DETECTION APPARATUS, POWER RECEIVING APPARATUS, NON-CONTACT POWER TRANSMISSION SYSTEM AND DETECTION METHOD

RELATED APPLICATION DATA

This application is a continuation of U.S. patent application Ser. No. 15/271,852 filed Sep. 21, 2016, which is a continuation of U.S. patent application Ser. No. 13/689,100 filed Nov. 29, 2012, now U.S. Pat. No. 9,482,702 issued Nov. 1, 2016, the entireties of which are incorporated herein by reference to the extent permitted by law. The present application claims the benefit of priority to Japanese Patent Application No. JP 2011-280059 filed on Dec. 21, 2011 in the Japan Patent Office, the entirety of which is incorporated by reference herein to the extent permitted by law.

BACKGROUND

The present disclosure relates to a detection apparatus for detecting existence of a conductor such as a metal between a power transmitting apparatus and a power receiving apparatus. In addition, the present disclosure also relates to the power receiving apparatus, a non-contact power transmission system and a detection method.

In recent years, a non-contact power transmission system for supplying electric power by adoption of a wireless technique is developed aggressively. Methods for supplying electric power by adoption of a wireless technique include two methods to be described as follows.

One of the two methods is an electromagnetic induction method which is already known widely. In the electromagnetic induction method, the degree of junction between the power transmitting side and the power receiving side is very high so that electric power can be supplied from the power transmitting side to the power receiving side with a high degree of efficiency. Since the coefficient of junction between the power transmitting side and the power receiving side needs to be held at a high value, however, the efficiency of power transmission between coils on the power transmitting side and the power receiving side deteriorates considerably if the distance between the power transmitting side and the power receiving side increases or if the power transmitting side is shifted from a position exposed to the power receiving side. In the following description, the efficiency of power transmission between coils on the power transmitting side and the power receiving side is also referred to as an inter-coil efficiency.

The other method is a technique referred to as a magnetic resonance method. The magnetic resonance method is characterized in that, by utilizing a resonance phenomenon deliberately, the magnetic flux shared by the power supplier and the power receiver is small. In the magnetic resonance method, even for a small coefficient of junction, the inter-coil efficiency does not deteriorate provided that the Q factor (quality factor) is high. The Q factor is an indicator representing a relation between energy holding and energy losing in circuits including the coils on the power transmitting side and the power receiving side. That is to say, the Q factor is an indicator representing the strength of resonance of a resonant circuit. In other words, the magnetic resonance method offers a merit that the axis of the coil on the power receiving side does not have to be adjusted to the axis of the coil on the power transmitting side. Other merits include a high degree of freedom in selecting the positions of the power transmitting side and the power receiving side as well as a high degree of freedom in setting the distance between the power transmitting side and the power receiving side.

One of important elements in the non-contact power transmission system is a countermeasure to be taken against heat dissipated by a metallic foreign substance. When electric power is supplied from a power transmitting side to a power receiving side by adoption of a non-contact technique not limited to the electromagnetic induction method or the magnetic resonance method, a metal may exist between the power transmitting side and the power receiving side. In this case, an eddy current may flow in the metal so that it is feared that the metal dissipates heat. As a countermeasure to be taken against the heat dissipated by the metal, there have been proposed a number of techniques for detecting such a metallic foreign substance. For example, techniques making use of a light sensor or a temperature sensor are known. However, a method for detecting a metal by making use of a sensor is expensive if the power supplying range is wide as is the case with the magnetic resonance method. In addition, if a temperature sensor is used for example, a result output by the temperature sensor is dependent on the thermal conductivity of the surroundings of the sensor. Thus, design restrictions are imposed on equipment on the power transmitting side and the power receiving side.

In order to solve the problems described above, there has been proposed a technique for determining whether or not a metallic foreign substance exists between the power transmitting side and the power receiving side through examination of parameter changes caused by existence of the metallic foreign substance. The changes of parameters typically include changes in current and changes in voltage. By adoption of such a technique, it is no longer necessary to impose design restrictions on equipment on the power transmitting side and the power receiving side. In addition, the cost can be reduced. As described in Japanese Patent Laid-open No. 2008-206231 (hereinafter referred to as Patent Document 1) for example, there has been proposed a technique for detecting a metallic foreign substance through examination of the degree of modulation in transmission between the power transmitting side and the power receiving side. That is to say, a metallic foreign substance is detected by examining information on amplitude changes and phase changes. In addition, as described in Japanese Patent Laid-open No. 2001-275280 (hereinafter referred to as Patent Document 2), there has been proposed a technique for detecting a metallic foreign substance through examination of an eddy-current loss. This technique is also referred to as a foreign-substance detection method based on a DC-DC efficiency.

SUMMARY

However, the techniques disclosed in Patent Documents 1 and 2 do not consider effects of a metallic case used on the power receiving side. It is quite within the bounds of possibility that ordinary mobile equipment receiving electric power on the power receiving side makes use of some metals such as a metallic case and metallic components. In such a case, it is difficult to determine whether a change of a parameter has been caused by an effect of the metallic case or the like or has been caused by the existence of a metallic foreign substance. In the case of the technique disclosed in Patent Document 2 for example, it is difficult to determine whether an eddy-current loss has been incurred in the metallic case of the mobile equipment or incurred due to the existence of a metallic foreign substance between the power transmitting side and the power receiving side. Thus, as is obvious from the above descriptions, the techniques disclosed in Patent Documents 1 and 2 cannot be said to be techniques capable of detecting a metallic foreign substance with a high degree of precision.

The present disclosure has been made in order to solve the problems described above. It is desirable to increase the precision of detection of a metallic foreign substance existing between the power transmitting side and the power receiving side.

In accordance with an embodiment of the present disclosure, there is provided a detection apparatus including: a resonant circuit provided with a Q-factor measurement coil and one or more capacitors to serve as a circuit for receiving pulses; a response-waveform detecting section configured to detect the waveform of a response output by the resonant circuit in response to the pulses; and a Q-factor measuring section configured to measure a Q factor of the resonant circuit from the response waveform detected by the response-waveform detecting section.

In accordance with another embodiment of the present disclosure, there is provided a power receiving apparatus including: a power receiving coil electromagnetically coupled to an external apparatus; a power receiving section configured to receive electric power from the external apparatus through the power receiving coil; a resonant circuit provided with a Q-factor measurement coil and one or more capacitors to serve as a circuit for receiving pulses; a response-waveform detecting section configured to detect the waveform of a response output by the resonant circuit in response to the pulses; and a Q-factor measuring section configured to measure a Q factor of the resonant circuit from the response waveform detected by the response-waveform detecting section.

In accordance with still another embodiment of the present disclosure, there is provided a non-contact power transmission system including: a power transmitting apparatus configured to transmit electric power by adoption of a non-contact transmission technique; and a power receiving apparatus configured to receive the electric power from the power transmitting apparatus, wherein the power receiving apparatus includes a power receiving coil electromagnetically coupled to a power transmitting coil of the power transmitting apparatus, a power receiving section configured to receive electric power from the power transmitting apparatus through the power receiving coil, a resonant circuit provided with a Q-factor measurement coil and one or more capacitors to serve as a circuit for receiving pulses, a response-waveform detecting section configured to detect the waveform of a response output by the resonant circuit in response to the pulses, and a Q-factor measuring section configured to measure a Q factor of the resonant circuit from the response waveform detected by the response-waveform detecting section.

In accordance with a further embodiment of the present disclosure, there is provided a detection method including: applying pulses to a resonant circuit provided with a Q-factor measurement coil and one or more capacitors; driving a response-waveform detecting section to detect the waveform of a response output by the resonant circuit in response to the pulses; and driving a Q-factor measuring section to measure a Q factor of the resonant circuit from the response waveform detected by the response-waveform detecting section.

In accordance with the present disclosure, by making use of a simple configuration, it is possible to increase the precision of detection of a metallic foreign substance existing between the power transmitting side and the power receiving side.

BRIEF DESCRIPTION OF THE DRAWINGS

FIG. 6A is an enlarged diagram showing the waveform of a pulse generated by a pulse generator;

FIG. 6B is a diagram showing a train of pulses generated by the pulse generator;

FIG. 6C is a diagram showing a frequency-domain response to the pulse train;

FIG. 6D is an enlarged diagram showing a frequency-domain response to the pulse train;

FIG. 6E is a diagram showing the frequency-domain response waveform of a voltage appearing at the two terminals of a capacitor shown in FIG. 5;

FIG. 7A is an enlarged diagram showing the waveform of a pulse generated by the pulse generator;

FIG. 7B is a diagram showing a train of pulses generated by the pulse generator;

FIG. 7C is a diagram showing a pulse train in the frequency domain;

FIG. 7D is a diagram showing a pulse train in the frequency domain by enlarging the inside of each pulse;

FIG. 7E is a diagram showing the frequency-domain response waveform of a voltage appearing at the two terminals of the capacitor shown in FIG. 5;

FIG. 8A is a diagram showing a time-domain response waveform;

FIG. 8B is a diagram showing a frequency-domain response waveform;

FIG. 9A is a diagram showing a time-domain response waveform;

FIG. 9B is a diagram showing a frequency-domain response waveform;

DETAILED DESCRIPTION OF THE PREFERRED EMBODIMENTS

Figure 1:
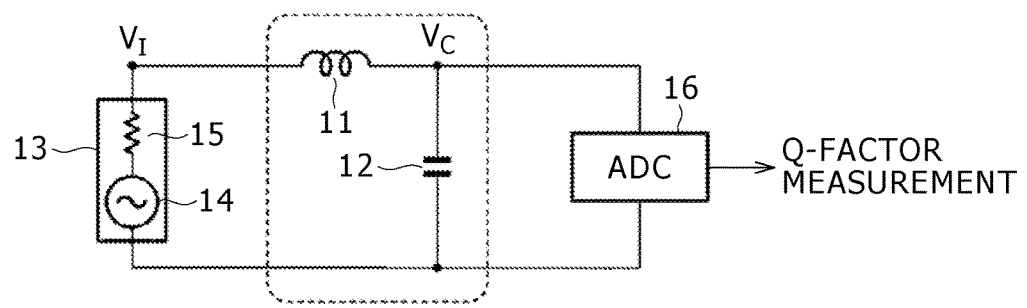
FIG. 1 is a diagram roughly showing a typical detection circuit for detecting a metallic foreign substance by measurement of a Q factor.

Embodiments of the present disclosure are explained by referring to the diagrams as follows. It is to be noted that, throughout the diagrams and this specification, configuration elements having functions essentially identical with each other and/or having configurations essentially identical with each other are denoted by the same reference numeral, and duplicate descriptions are omitted.

It is to be noted that the description of the embodiments is divided into topics arranged in the following order:
1: Introduction
2: First Embodiment (Signal source: Example using a pulse generator)
3: Second Embodiment (Detection circuit: Typical application to a power receiving apparatus)
4: Third Embodiment (Detection circuit: Example employing an envelop-line detecting circuit)
5: Fourth Embodiment (Q-factor measurement: Typical Q-factor measurement using the number of vibrations)
6: Fifth Embodiment (Q-factor measurement: Typical Q-factor measurement based on a voltage $V_2$ in a predetermined range)
7: Sixth Embodiment (Q-factor measurement: Typical Q-factor measurement based on a time limit even for the voltage $V_2$ not in a predetermined range)
8: Others

1: Introduction

Detection of a Metallic Foreign Substance by Measurement of the Q Factor

In order to detect a metallic foreign substance, which exists between the power transmitting side and the power receiving side, with a high degree of precision, there has been conceived a method for determining whether or not a metallic foreign substance exists at a position close to a coil included in a resonant circuit on the power receiving side as a coil coupled magnetically with an external component on the power transmitting side on the basis of a measured Q factor (quality factor) of the circuit. It is possible to determine whether or not such a metallic foreign substance exists because, as the metallic foreign substance approaches the resonant circuit, the Q factor of the circuit decreases.

The Q factor of a resonant circuit is an indicator representing a relation between energy holding and energy losing in the resonant circuit. In general, the Q factor is used as a value representing the sharpness of the peak of the resonance curve of the resonant circuit. In other words, the Q factor is used as a value representing the degree of the resonance of the resonant circuit.

The detection of the metallic foreign substance is performed on a circuit existing between the power transmitting side and the power receiving side and including an unintended coil and a conductor such as a metal. The technical term "conductor" used in this specification means a conductor in the broad sense of the term. Thus, the technical term "conductor" used in this specification can also be interpreted as a semiconductor. In the following description, an operation to detect a circuit including such a coil and a conductor such as a metal is referred to as detection of conductors and the like.

A typical detection circuit for detecting a metallic foreign substance by measurement of the Q factor is explained as follows.

FIG. 1 is a diagram roughly showing a typical detection circuit 1 for detecting a metallic foreign substance by measurement of the Q factor of a resonant circuit.

As shown in the figure, the detection circuit 1 includes a Q-factor measurement coil 11, a capacitor 12, a signal source 13 and an ADC 16 which is an analog-to-digital converter. The detection circuit 1 shown in FIG. 1 is a rough circuit referred to in explanation of an outline of an operation to detect a metallic foreign substance by measuring the Q factor of a resonant circuit which includes the Q-factor measurement coil 11 and the capacitor 12.

In the detection circuit 1, the Q-factor measurement coil 11 and the capacitor 12 are connected to each other in series to form the resonant circuit enclosed by a dashed line. The inductance of the Q-factor measurement coil 11 and the capacitance of the capacitor 12 are adjusted so that the resonant circuit resonates at a measurement frequency which is referred to as a resonance frequency. In the following description, the inductance of the Q-factor measurement coil 11 and the capacitance of the capacitor 12 are also referred to as an L value and a C value respectively. The signal source 13 is connected to the resonant circuit which includes the Q-factor measurement coil 11 and the capacitor 12 as described above. A variable-frequency sinusoidal-signal generator 14 included in the signal source 13 generates a sinusoidal signal having a variable frequency and supplies the signal to the resonant circuit. A resistor 15 in the signal source 13 represents the internal resistance of the variable-frequency sinusoidal-signal generator 14 or the output impedance of the variable-frequency sinusoidal-signal generator 14.

Analog signals generated at measurement points in the resonant circuit receiving the sinusoidal signal are supplied to the ADC 16 for converting the analog signals into a digital signal. Then, the Q factor of the resonant circuit is measured by making use of the digital signal output by the ADC 16 as a result of the analog-to-digital conversion. It is to be noted that the detection circuit 1 has a power-supply section not shown in the figure. The power-supply section supplies electric power to components employed in the detection circuit 1. As described above, the components employed in the detection circuit 1 include the signal source 13 and the ADC 16.

In the measurement of the Q factor of the resonant circuit, first of all, frequency sweeping is carried out on the sinusoidal signal applied to the resonant circuit in order to find a resonance frequency $f_0$ at which a voltage output by the resonant circuit attains a maximum value. Then, at the resonance frequency $f_0$, a voltage $V_I$ and a voltage $V_C$ are measured and the measured voltages are used in the measurement of the Q factor. As shown in FIG. 1, the voltage $V_I$ is a voltage appearing at a connection point between the Q-factor measurement coil 11 and the signal source 13 whereas the voltage $V_C$ is a voltage appearing at a connection point between the Q-factor measurement coil 11 and the capacitor 12. Typically, an LCR meter is used as a Q-factor measuring apparatus in the measurement of the Q factor.

The Q factor of the resonant circuit is expressed by Equation 1 given below. In the equation, reference notation $V_I$ denotes a voltage appearing at a connection point between the Q-factor measurement coil 11 and the signal source 13 whereas reference notation $V_C$ denotes a voltage appearing at a connection point between the Q-factor measurement coil 11 and the capacitor 12 as described above. On the other hand, reference notation R denotes a series resistance at the resonance frequency $f_0$.

$$Q = \frac{1}{R}\sqrt{\frac{L}{C}} = \frac{V_C}{V_I} \quad \text{[Equation 1]}$$

As is obvious from the above equation, the voltage $V_C$ is about Q times the voltage $V_I$. As is commonly known, the series resistance R and the inductance L which are used in Equation 1 change when a metal approaches the resonant circuit or change due to an effect of an eddy current generated in the metal. When a metallic piece approaches the Q-factor measurement coil 11 for example, the effective series resistance R much increases and, thus, the Q factor decreases. That is to say, due to an effect of a metal existing in the vicinity of the Q-factor measurement coil 11, the Q factor of the resonant circuit and the resonance frequency of the resonant circuit change much. Thus, by detecting these changes, it is possible to detect a metallic piece existing in the vicinity of the Q-factor measurement coil 11. The present disclosure is applied to detection of a metallic foreign substance inserted between first and secondary sides which are the power transmitting side and the power receiving side respectively.

By making use of a Q-factor change described above to detect a metallic foreign substance with a high degree of precision, the metallic foreign substance can be removed without regard to whether the adopted method is the electromagnetic induction method or the magnetic resonance method. In particular, the Q factor of the resonant circuit employing a Q-factor measurement coil in equipment on the power receiving side serving as the secondary side can be used as a parameter which is sensitive to a metallic foreign substance because a relation between the position of the metallic case of the equipment on the power receiving side and the position of the Q-factor measurement coil is all but fixed. Thus, an effect of the metallic case on the Q-factor measurement coil can be eliminated. That is to say, in comparison with the power transmitting side, the Q factor of a resonant circuit provided on the power receiving side is proper for high-precision detection of a metallic foreign substance.

In addition, the Q factor of a resonant circuit can be computed by adoption of a half-band width method.

Figure 2:
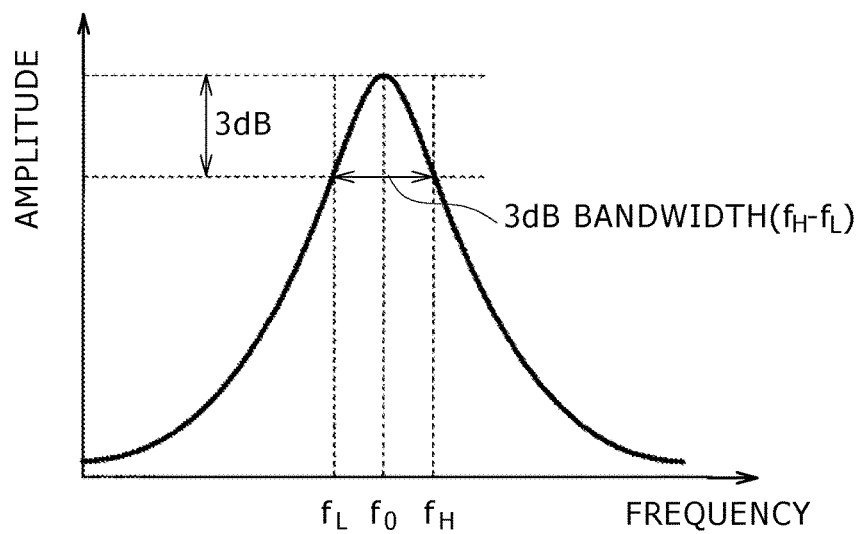
FIG. 2 is a diagram showing a graph representing a typical frequency characteristic of a voltage output by a series resonant circuit.

The half-bandwidth method is based on Equation 2 given below. As is obvious from the equation, the Q factor is found from the resonance frequency $f_0$, a relatively low frequency $f_L$ and a relatively high frequency $f_H$. As explained earlier, the resonance frequency $f_0$ is a frequency at which the amplitude of a voltage output by the resonant circuit attains a maximum value also referred to as a peak value. The resonance frequency $f_0$ is found by execution of frequency sweeping on the sinusoidal signal applied to the resonant circuit. As shown in FIG. 2, the relatively low frequency $f_L$ is a frequency lower than the resonance frequency $f_0$ whereas the relatively high frequency $f_H$ is a frequency higher than the resonance frequency $f_0$. At the relatively low frequency $f_L$ and the relatively high frequency $f_H$, the amplitude of the voltage output by the resonant circuit decreases from the peak value by 3 dB to a value equal to $(1/\sqrt{2})$ times the peak value. To be more specific, in accordance with Equation 2, the Q factor is found by dividing the resonance frequency $f_0$ by a bandwidth of $(f_H-f_L)$ between the frequencies $f_H$ and $f_L$ at which the amplitude of the voltage output by the resonant circuit decreases from the peak value by 3 dB to a value equal to $(1/\sqrt{2})$ times the peak value.

$$Q = \frac{f_0}{f_H - f_L} \quad \text{[Equation 2]}$$

It is to be noted that the series resonant circuit described above is no more than a typical resonant circuit. Explanation of a parallel resonant circuit can be obtained by reversing some phrases in the above explanation. That is to say, in the same way as the series resonant circuit, the Q factor is found from the resonance frequency $f_0$, a relatively low frequency $f_L$ and a relatively high frequency $f_H$. In this case, however, the resonance frequency $f_0$ is a frequency at which the amplitude of a voltage output by the resonant circuit attains a minimum value. To be more specific, in accordance with Equation 2, the Q factor is found by dividing the resonance frequency $f_0$ by a bandwidth of $(f_H-f_L)$ between the frequencies $f_H$ and $f_L$ at which the amplitude of the voltage output by the parallel resonant circuit increases from the minimum value by 3 dB to a value equal to $(\sqrt{2})$ times the minimum value.

In the case of either of the Q-factor measurement methods, however, the resonance frequency $f_0$ is found by execution of frequency sweeping on the sinusoidal signal applied to the resonant circuit in the course of the Q-factor measurement. It is thus necessary to provide a variable-frequency sinusoidal-signal generator having an excellent frequency resolution. In addition, since the frequency sweeping may be carried out, it takes time to perform the Q-factor measurement.

On top of that, in the case of the former method, the voltage $V_I$ is about 1/Q times the voltage $V_C$. Thus, since the voltage $V_I$ has a low level, it is difficult to measure the Q factor with a high degree of accuracy. That is to say, the precision of the measurement of the Q factor is low.

In order to solve the problem described above, the Q factor is measured by execution of processing based on pulses applied to the resonant circuit. If pulses are used in place of a sinusoidal signal, it is no longer necessary to provide a variable-frequency sinusoidal-signal generator having an excellent frequency resolution.

2: First Embodiment

Typical Configuration of a Detection Circuit

Figure 3:
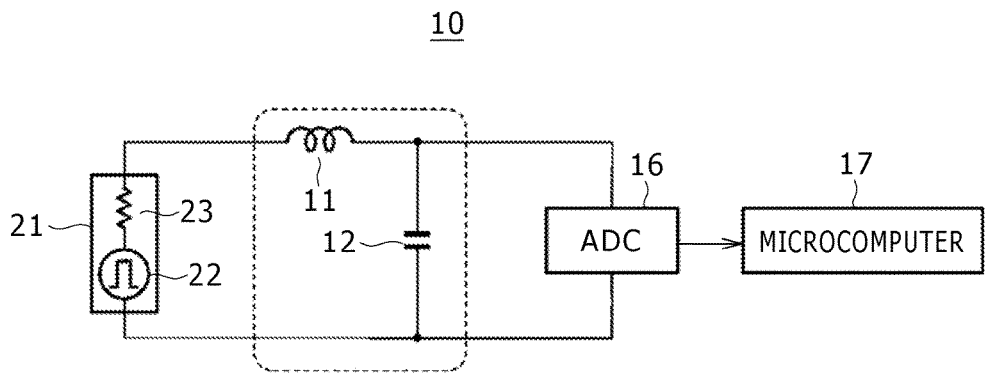
FIG. 3 is a diagram roughly showing a typical detection circuit according to a first embodiment of the present disclosure.

FIG. 3 is a diagram roughly showing a typical detection circuit 10 to which the detection apparatus according to a first embodiment of the present disclosure is applied. The detection circuit 10 shown in FIG. 3 is a circuit shown roughly in the explanatory diagram referred to in the following description of an outline of an operation to detect a metallic foreign substance by measuring the Q factor. In FIG. 3, an element having a function and/or a configuration which are essentially identical with those of its counterpart shown in FIG. 1 is denoted by the same reference numeral as the counterpart. In addition, the explanation of the identical element is omitted in order to avoid duplications of the description of the element.

The detection circuit 10 according to this embodiment is provided with a signal source 21 replacing the signal source 13 employed in the detection circuit 1 shown in FIG. 1.

The signal source 21 is connected to a resonant circuit enclosed by a dashed line. In the resonant circuit, a Q-factor measurement coil 11 and a capacitor 12 are connected to each other in series. The signal source 21 includes a pulse generator 22 for generating pulses at periods determined in advance. A resistor 23 in the signal source 21 represents the internal resistance of the pulse generator 22 or the output impedance of the pulse generator 22.

In addition, the detection circuit 10 also includes an ADC 16 and a microcomputer 17. The ADC 16 is a typical response-waveform detecting section for detecting the waveform of a response output by the resonant circuit in response to the pulse signal received from the signal source 21. On the other hand, the microcomputer 17 receives a digital signal from the ADC 16. The remaining configuration of the detection circuit 10 is identical with that of the detection circuit 1.

It is to be noted that the detection circuit 10 has a power-supply section not shown in the figure as with the case of the detection circuit 1. The power-supply section supplies electric power to components employed in the detection circuit 10. As described above, the components employed in the detection circuit 10 include the signal source 21, the ADC 16 and the microcomputer 17.

The operation of the detection circuit 10 is explained briefly as follows.

Pulses output by the pulse generator 22 employed in the signal source 21 are applied to the resonant circuit. A voltage appearing at the connection point between the Q-factor measurement coil 11 and the capacitor 12 is sequentially fetched and supplied to the ADC 16. The voltage appearing at the connection point between the Q-factor measurement coil 11 and the capacitor 12 is a voltage appearing between the two terminals of the capacitor 12. The ADC 16 converts the analog signal of the voltage into a digital signal in order to obtain the time-domain waveform of a response to the pulses applied to the resonant circuit. The ADC 16 supplies the time-domain response waveform to the microcomputer 17 which then processes the waveform in order to compute the Q factor. The microcomputer 17 finally detects existence of a metallic foreign substance on the basis of the computed Q factor.

The following description explains a configuration and an operation which are related to processing carried out by the microcomputer 17 in order to detect a metallic foreign substance in accordance with this embodiment.

Figure 4:
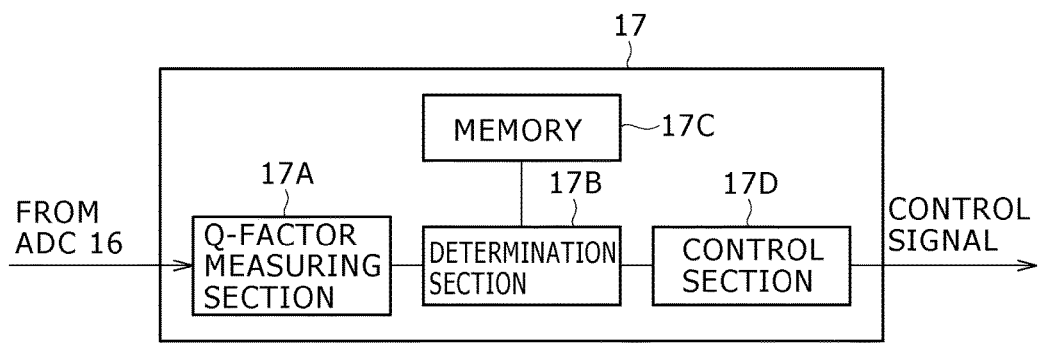
FIG. 4 is a block diagram showing a typical internal configuration of a microcomputer shown in FIG. 3.

FIG. 4 is a block diagram showing a typical internal configuration of the microcomputer 17.

As shown in the figure, the microcomputer 17 according to this embodiment is configured to include a Q-factor measuring section 17A, a determination section 17B, a memory 17C and a control section 17D. The microcomputer 17 is a typical processing apparatus. The microcomputer 17 measures the Q factor of the resonant circuit and controls the detection circuit 10 or the entire equipment provided with the detection circuit 10.

The Q-factor measuring section 17A is a typical Q-factor measuring section. The Q-factor measuring section 17A carries out processing to be described later on the digital voltage signal received from the ADC 16 in order to find the Q factor. The Q-factor measuring section 17A supplies the Q factor to the determination section 17B. The amplitude of the digital voltage signal received from the ADC 16 represents the vibration of the signal. The vibration of the digital voltage signal is shifted or attenuated with the lapse of time. The Q-factor measuring section 17A computes the Q factor on the basis of the time-wise shift of the vibration of the digital voltage signal.

The determination section 17B is a typical determination section for comparing the Q factor received from the Q-factor measuring section 17A with a reference value determined in advance in order to determine whether or not a metallic foreign substance exists in the vicinity of the Q-factor measurement coil 11. The determination section 17B supplies the result of the determination to the control section 17D. By comparing the Q factor of the resonant circuit including the Q-factor measurement coil 11 with the reference value as described above, it is possible to infer electromagnetic coupling between the Q-factor measurement coil 11 and the external world. Thus, by properly setting the reference value, it is possible to precisely determine whether or not a metallic foreign substance exists between the Q-factor measurement coil 11 and the external world.

The memory 17C is a typical nonvolatile storage section. The memory 17C is used for storing the reference value of the Q factor of the resonant circuit employing the Q-factor measurement coil 11 for every frequency. The reference value is a value determined in advance for a state in which nothing exists in the vicinity of the Q-factor measurement coil 11 or for a state in which nothing exists between the Q-factor measurement coil 11 and an external coil. In addition, the memory 17C can also be used for storing an ID number assigned to every equipment employing the detection circuit 10 to serve as information used for identifying the equipment. On top of that, the memory 17C can also be used for storing other information such as an ID number acquired from external equipment.

The control section 17D is a typical control section for generating control signals according to a determination result received from the determination section 17B and making use of the control signals to control, among others, the entire detection circuit 10 and non-contact power transmission carried out by execution of communications with equipment employing an external coil.

The figure shows a typical configuration in which the Q-factor measuring section 17A, the determination section 17B and the control section 17D are included in the microcomputer 17. It is to be noted, however, that one or more combinations of any ones of the Q-factor measuring section 17A, the determination section 17B and the control section 17D can also be typically included in another processing apparatus in a distributed-processing environment or the like.

The pulses have a simple rectangular waveform in the time domain. If the simple rectangular waveform in the time domain is transformed into a waveform in the frequency domain, however, the waveform in the frequency domain has a spectrum spread over a wide range. Thus, by properly selecting the waveform of the pulses, it is possible to obtain a spectrum having a comb shape with approximately the same amplitude in the vicinity of the resonance frequency. Accordingly, by applying a pulse to the resonant circuit and observing the response to the pulse, it is possible to obtain the frequency characteristic of the impedance of the resonant circuit. In addition, the Q factor can also be computed by carrying out the processing in the time domain.

Simulation Results

The following description explains results obtained by simulating the detection circuit 10.

Figure 5:
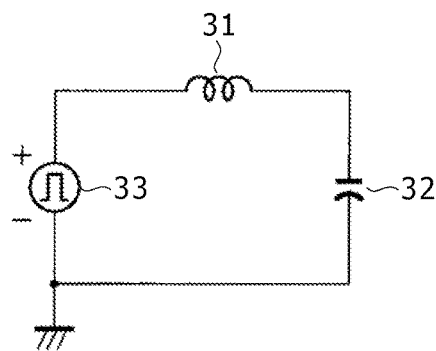
FIG. 5 is a diagram showing a simulation circuit constructed as a model of the detection circuit shown in FIG. 3.

FIG. 5 is a diagram showing a simulation circuit constructed as a model of the detection circuit 10.

The simulation circuit shown in FIG. 5 includes a pulse generator 33 and an LC resonant circuit corresponding to the block enclosed by a dashed line in FIG. 3. The LC resonant circuit resonates at pulse waves having a frequency of 100 Hz. The LC resonant circuit includes a Q-factor measurement coil 31 and a capacitor 32. As a first condition, the Q factor of the LC resonant circuit is set at 100 and the pulse generator 33 is set to generate pulse waves having an amplitude of 1 V and a pulse width of 1 µsec for a repetition period of 2 msec.

The effective resistance R of the LC resonant circuit is expressed by the equation R=√(Ls/Cs)/Qs where reference notation Ls denotes an inductance expressed in terms of H as the inductance of the Q-factor measurement coil 31, reference notation Cs denotes a capacitance expressed in terms of F as the capacitance of the capacitor 32 and reference notation Qs denotes the Q factor of the LC resonant circuit.

For a First Condition

Figure 6E:
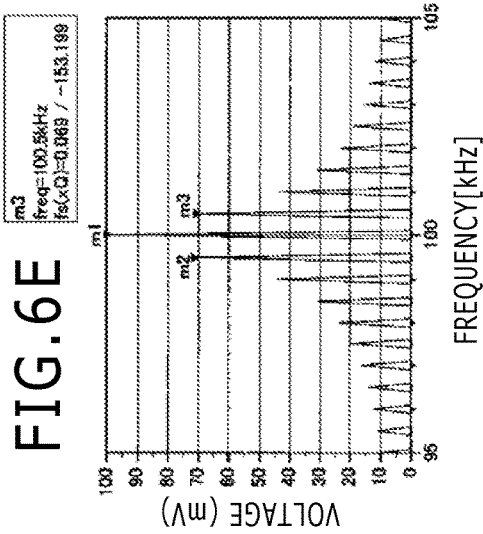
FIGS. 6A to 6E are a plurality of diagrams showing typical waveforms obtained at a variety of measurement points of the simulation circuit with no metallic foreign substance under a first condition, that is, a condition with a Q factor of 100 and a repetition period of 2 ms.
Figure 6B:
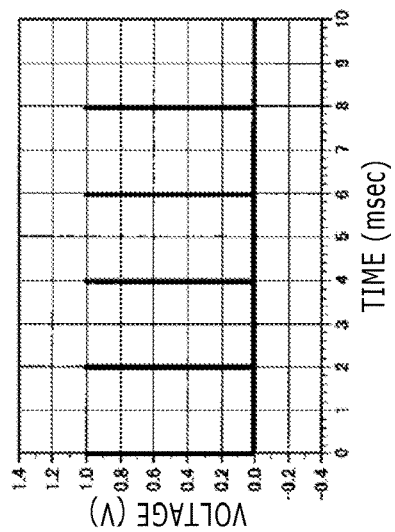
Figure 6D:
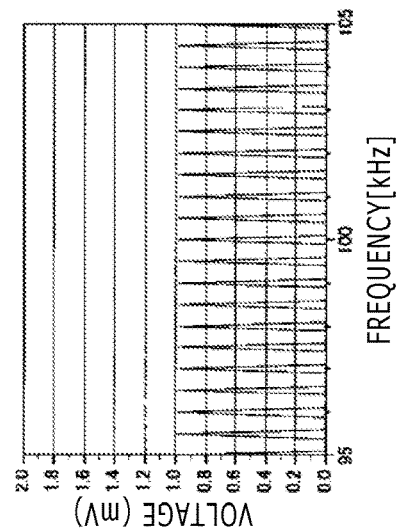
Figure 6A:
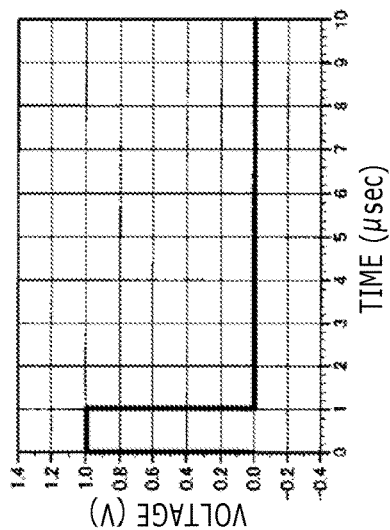
Figure 6C:
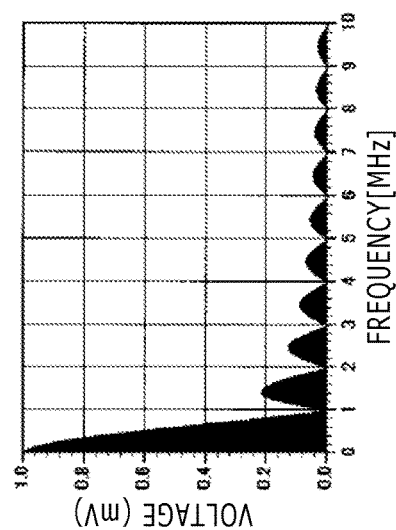

FIGS. 6A to 6E are a plurality of diagrams showing typical waveforms obtained at a variety of measurement points of the simulation circuit shown in FIG. 5 with no metallic foreign substance under the first condition, that is, a condition with a Q factor of 100 and a repetition period of 2 ms. To be more specific, FIG. 6A is an enlarged diagram showing the waveform of a pulse generated by the pulse generator 33 shown in FIG. 5 whereas FIG. 6B is a diagram showing a train of pulses generated by the pulse generator 33. FIG. 6C is a diagram showing a frequency-domain response to the pulse train whereas FIG. 6D is an enlarged diagram showing a frequency-domain response to the pulse train. On the other hand, FIG. 6E is a diagram showing the frequency-domain response waveform of a voltage appearing at the two terminals of the capacitor 32 shown in FIG. 5.

As shown in FIG. 6B, the pulse train generated by the pulse generator 33 is a train of pulses each having an amplitude of 1 V and a pulse width of 1 µsec. The pulse train is generated for a repetition period of 2 msec. FIG. 6A shows the waveform of a pulse generated by the pulse generator 33 by expanding the time axis of the pulse train shown in FIG. 6B from the msec order to the µsec order.

The frequency-domain response shown in FIG. 6C is obtained by transforming the time-domain pulse waveform shown in FIG. 6A into a waveform in the frequency domain. If the frequency axis of the frequency-domain response shown in FIG. 6C is expanded, it is possible to obtain a spectrum having a comb shape with an approximately uniform amplitude of 1 mV in the vicinity of the resonance frequency of 100 kHz as shown in FIG. 6D.

Let a pulse wave having such a spectrum be applied to the LC resonant circuit and let the time-domain response waveform of a voltage appearing at the terminals of the capacitor 32 be transformed into a waveform in the frequency domain. In this case, the result of the transformation is the frequency-domain response waveform shown in FIG. 6E. The time-to-frequency transformation processing is carried out by the ADC 16 employed in the detection circuit 10. As an alternative, in place of the ADC 16, the Q-factor measuring section 17A employed in the microcomputer 17 may carry out the time-to-frequency transformation processing.

In the case of pulse waves satisfying the first condition, that is, a condition with a Q factor of 100 and a repetition period of 2 ms, the pulse interval is short and the amplitude (or an average electric power) obtained as a result of a frequency analysis is large but the frequency resolution is poor.

For a Second Condition

Figure 7A:
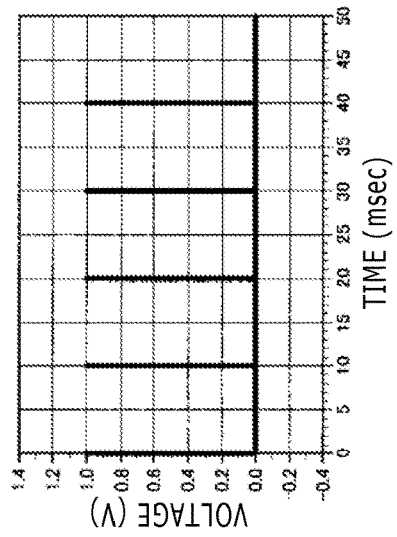
FIGS. 7A to 7E are a plurality of diagrams showing typical waveforms obtained at a variety of measurement points of the simulation circuit with no metallic foreign substance under a second condition, that is, a condition with a Q factor of 100 and a repetition period of 10 ms.
Figure 7B:
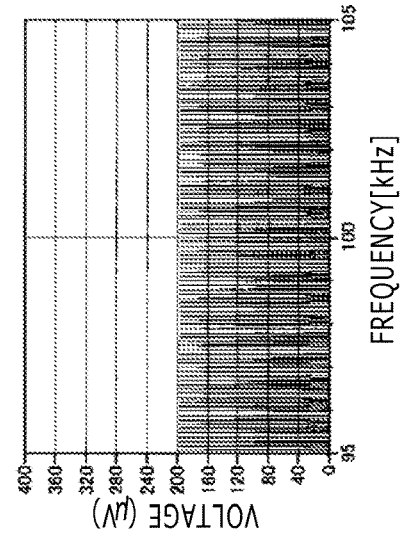
Figure 7E:
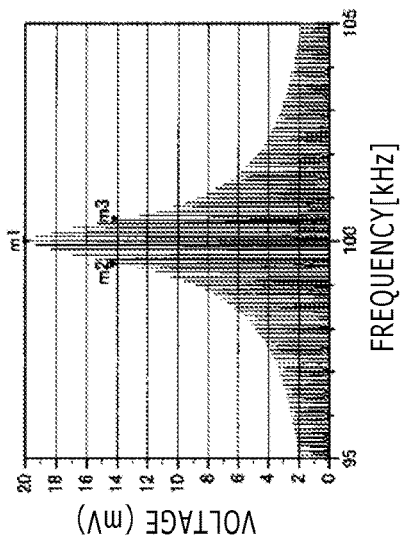
Figure 7C:
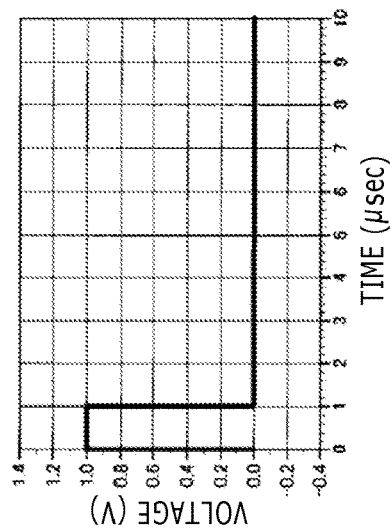
Figure 7D:
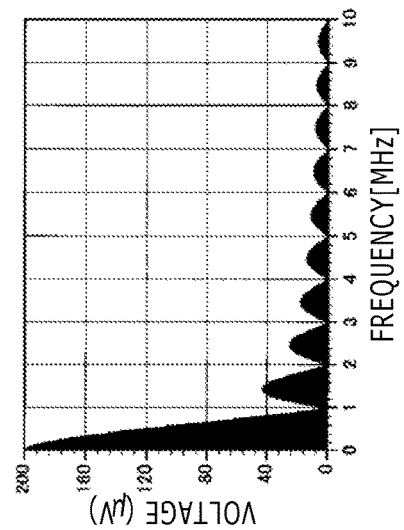

FIGS. 7A to 7E are a plurality of diagrams showing typical waveforms obtained at a variety of measurement points of the simulation circuit shown in FIG. 5 with no metallic foreign substance under a second condition, that is, a condition with a Q factor of 100 and a repetition period of 10 ms. To be more specific, FIG. 7A is an enlarged diagram showing the waveform of a pulse generated by the pulse generator 33 shown in FIG. 5 whereas FIG. 7B is a diagram showing a train of pulses generated by the pulse generator 33. FIG. 7C is a diagram showing a frequency-domain response to the pulse train whereas FIG. 7D is an enlarged diagram showing a frequency-domain response C to the pulse train. On the other hand, FIG. 7E is a diagram showing the frequency-domain response waveform of a voltage appearing at the two terminals of the capacitor 32 shown in FIG. 5.

As shown in FIG. 7B, the pulse train generated by the pulse generator 33 is a train of pulses each having an amplitude of 1 V and a pulse width of 1 µsec. The pulse train is generated for a repetition period of 10 msec. FIG. 7A shows the waveform of a pulse generated by the pulse generator 33 by expanding the time axis of the pulse train shown in FIG. 7B from the msec order to the µsec order.

The pulse train shown in FIG. 7C is obtained by transforming the time-domain pulse waveform shown in FIG. 7A into a waveform in the frequency domain. If the frequency axis of the frequency-domain response to the pulse train shown in FIG. 7C is expanded, it is possible to obtain a spectrum having a comb shape with an approximately uniform amplitude of 200 µV in the vicinity of the resonance frequency of 100 kHz as shown in FIG. 7D.

Let a pulse wave having such a spectrum be applied to the LC resonant circuit and let the time-domain response waveform of a voltage appearing at the terminals of the capacitor 32 be transformed into a waveform in the frequency domain. In this case, the result of the transformation is the frequency-domain response waveform shown in FIG. 7E.

In the case of pulse waves satisfying the second condition, that is, a condition with a Q factor of 100 and a repetition period of 10 ms, the pulse interval is long and the amplitude (or an average electric power) obtained as a result of a frequency analysis is small but the frequency resolution is excellent.

As described above, the amplitude obtained as a result of a frequency analysis and the frequency resolution can be changed by not only the amplitude of a pulse wave, but also the pulse interval (or the pulse period). The amplitude and the frequency resolution are in a tradeoff relation to each other. It is desirable that a person in charge of measurements properly selects a large amplitude or an excellent frequency resolution in accordance with the object of measurement.

In both the first and second conditions, the Q factor is set at 100. In accordance with Equation 2, the Q factor is expressed by the equation $Q = f_0/(f_H - f_L)$ where the expression $(f_H - f_L)$ represents the width of a frequency band. At the relatively low frequency $f_L$ and the relatively high frequency $f_H$ which serve as the edge frequencies of the band, the amplitude of the voltage output by the resonant circuit decreases from the peak value attained at the resonance frequency $f_0$ by 3 dB to a value equal to $(1/\sqrt{2} = 0.7071)$ times the peak value. From the frequency-domain response waveforms shown in FIGS. 6E and 7E, the relatively high frequency $f_H$, the resonance frequency $f_0$ and the relatively low frequency $f_L$ are found to be 100.5 kHz, 100 kHz and 99.5 kHz respectively. Thus, Q=100 kHz/(100.5 kHz−99.5 kHz)=100 which is a result obtained on the assumption that no metallic foreign substance exists.

Q-Factor Measurement Based on Analysis Results

Next, the following description explains a method for measuring the Q factor on the basis of results of analyses carried out in the time and frequency domains after the pulses described above have been applied to the LC resonant circuit shown in FIG. 5.

Figure 8A:
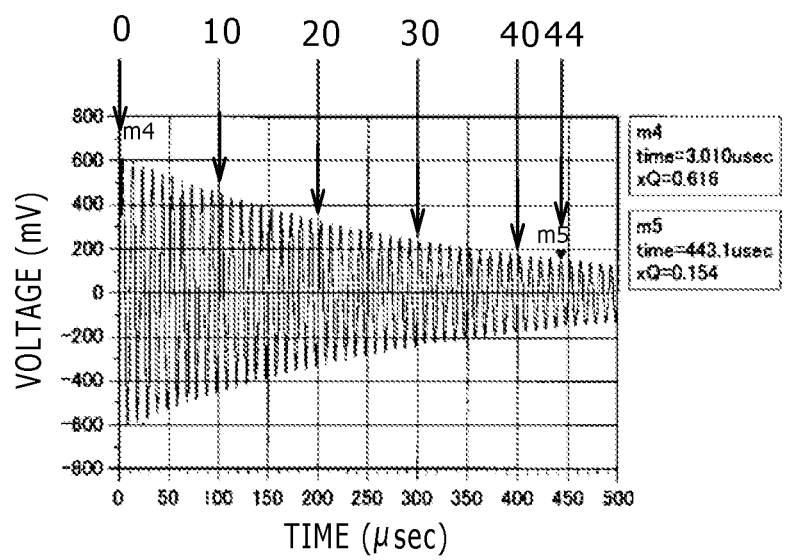
FIGS. 8A and 8B are a plurality of diagrams showing typical waveforms of a voltage appearing at the two terminals of a capacitor for a Q factor of 100 and a repetition period of 10 ms.
Figure 8B:
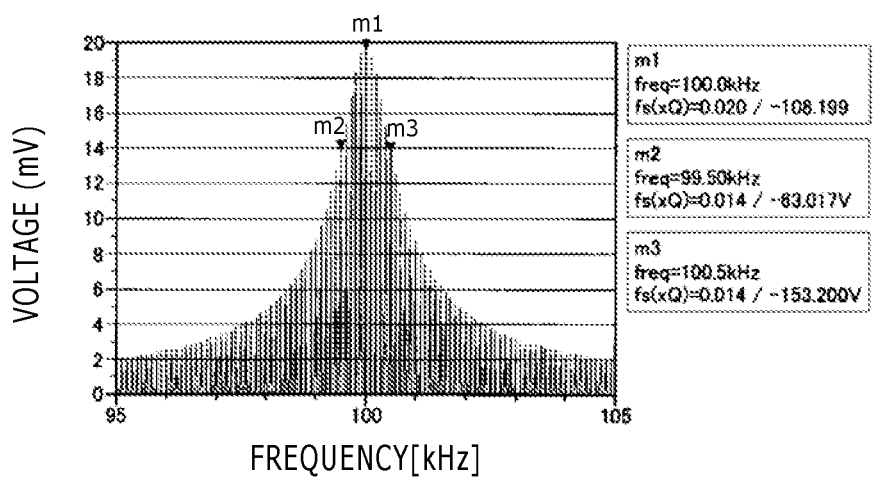

FIGS. 8A and 8B are a plurality of diagrams showing typical waveforms of a voltage appearing at the two terminals of the capacitor 32 for a Q factor of 100 and a repetition period of 10 ms. To be more specific, FIG. 8A is a diagram showing a time-domain response waveform whereas FIG. 8B is a diagram showing a frequency-domain response waveform.

On the assumption that no metallic foreign substance exists, the LC resonant circuit used in the analyses has a Q factor of 100 whereas the pulse train supplied to the circuit has a pulse amplitude of 1 V, a pulse width of 1 μsec and a pulse repetition period of 10 msec.

As shown in FIG. 8A, after pulses have been applied to the LC resonant circuit, the time-domain voltage appearing at the two terminals of the capacitor 32 is gradually attenuated. In addition, as shown in FIG. 8B, the frequency-domain voltages appearing at the two terminals of the capacitor 32 have a peak at the resonance frequency and an amplitude which is gradually attenuated as the frequency deviates from the resonance frequency. The larger the deviation of a frequency from the resonance frequency, the smaller the amplitude at the frequency.

Time Domain

The Q factor of the LC resonant circuit is expressed by Equation 3 given below. In this equation, reference notation f denotes the resonance frequency of the resonant circuit. Reference notation $V_1$ is the voltage appearing at the two terminals of the capacitor 32 at a time $t_1$ or a voltage observed at a measurement point m4 on the voltage waveform. By the same token, reference notation $V_2$ is the voltage appearing at the two terminals of the capacitor 32 at a time $t_2$ or a voltage observed at a measurement point m5 on the time-domain response waveform. The measurement point m5 is a point lagging behind the measurement point m4.

$$Q = \pi f \cdot \frac{t_2 - t_1}{\ln\left(\frac{V_1}{V_2}\right)} \quad \text{[Equation 3]}$$

The following description briefly explains a process of deriving the equation for finding the Q factor from the resonance frequency and amplitudes (that is, voltages) observed at two times on the time-domain response waveform.

First of all, an energy supplied to the resonant circuit is expressed by Equation 4 as follows.

$$\text{Energy } E = |a(t)|^2, a(t) = A \cdot e^{-\Gamma t} \cdot e^{j\omega t}$$

$$\text{Vibration term:} e^{j\omega t}(|e^{j\omega t}|=1) \quad \text{[Equation 4]}$$

Next, an electric power is taken into consideration. In order to make the explanation simple, the vibration term is omitted hereafter to result in Equation 5 given below. Equation 5 represents only the envelop-line term.

$$a(t) = A \cdot e^{-\Gamma t} \quad \text{[Equation 5]}$$

$$\therefore E = A^2 \cdot e^{-2\Gamma t} \quad \text{[Equation 6]}$$

Since an electric power P is an energy consumed in a unit time, the electric power P can be expressed by Equation 7 as follows.

$$P = -\frac{d}{dt} E = -\frac{d}{dt}(A^2 \cdot e^{-2\Gamma t}) = 2\Gamma(A^2 \cdot e^{-2\Gamma t}) = 2\Gamma E \quad \text{[Equation 7]}$$

The Q factor is defined as a ratio of an internal energy of a resonance system to an energy lost by the resonance system in one period. In this case, the following equation can be derived by substituting Equation 7 for the electric power P into the defined ratio as follows.

$$Q \equiv \frac{\text{internal energy of resonance system}}{\text{energy lost by resonance system in 1 rad}} = \frac{E}{P \cdot \frac{1}{\omega}} = \frac{\omega E}{P} = \frac{\omega E}{2\Gamma E} = \frac{\omega}{2\Gamma} \quad \text{[Equation 8]}$$

$$\therefore \Gamma = \frac{\omega}{2Q} \quad \text{[Equation 9]}$$

$$\therefore a(t) = A \cdot e^{-\frac{\omega}{2Q} t} \quad \text{[Equation 10]}$$

Then, Equations 11 to 13 are derived from Equation 10 and, finally, Equation 3 is obtained.

$$\frac{|a(t_1)|}{|a(t_2)|} = \frac{A \cdot e^{-\frac{\omega}{2Q} t_1}}{A \cdot e^{-\frac{\omega}{2Q} t_2}} = e^{-\frac{\omega}{2Q}(t_1 - t_2)} \quad \text{[Equation 11]}$$

$$\ln\left\{\frac{|a(t_1)|}{|a(t_2)|}\right\} = \frac{\omega}{2Q}(t_2 - t_1) \quad \text{[Equation 12]}$$

$$\therefore Q = \frac{\omega}{2} \cdot \frac{t_2 - t_1}{\ln\left\{\frac{|a(t_1)|}{|a(t_2)|}\right\}} = \pi f \cdot \frac{t_2 - t_1}{\ln\left\{\frac{|a(t_1)|}{|a(t_2)|}\right\}} \quad \text{[Equation 13]}$$

Data for the measurement point m4 on the time-domain response waveform includes $t_1 = 3.010$ μsec and $V_1 = 0.616$ V. By the same token, data for the measurement point m5 on the time-domain response waveform includes $t_2 = 443.1$ μsec and $V_2 = 0.154$ V. These pieces of data are substituted into Equation 3 to find the Q factor of the LC resonant circuit. In this case, a Q factor of 99.71 is obtained. The Q factor is computed as follows:

$Q$ factor $= \pi \cdot 100 \times 10^3 \cdot (3.010 \times 10^{-6} - 443.1 \times 10^{-6})/\ln(0.616/0.154) = 99.71$ Frequency Domain Next, the Q factor is computed from the frequency-domain response waveform shown in FIG. 8B as follows.

FIG. 8B shows three measurement points m1, m2 and m3. The measurement point m1 corresponds to a peak value observed at the resonance frequency of 100.0 kHz whereas the measurement points m2 and m3 each correspond to a voltage equal to $1/\sqrt{2}$ (=0.7071) times the peak value. To put it concretely, the measurement point m1 represents the resonance frequency of 100.0 kHz and the peak value of 0.020 V. On the other hand, the measurement point m2 represents a frequency of 99.5 kHz and a voltage of 0.014 V whereas the measurement point m3 represents a frequency of 100.5 kHz and a voltage of 0.014 V. In this case, the Q factor of the LC resonant circuit is found by making use of Equation 2 as follows.

$Q$ factor $= 100/(100.5 - 99.5) = 100$

The Q factor of 100 is about equal to the Q factor found from the time-domain response waveform shown in FIG. 8A.

It is to be noted that, for the purpose of comparison with analysis results shown in FIGS. 8A and 8B, the Q factor of the resonant circuit receiving applied pulses was changed and the same analyses for the time domain as well as the frequency domain were carried out.

Figure 9A:
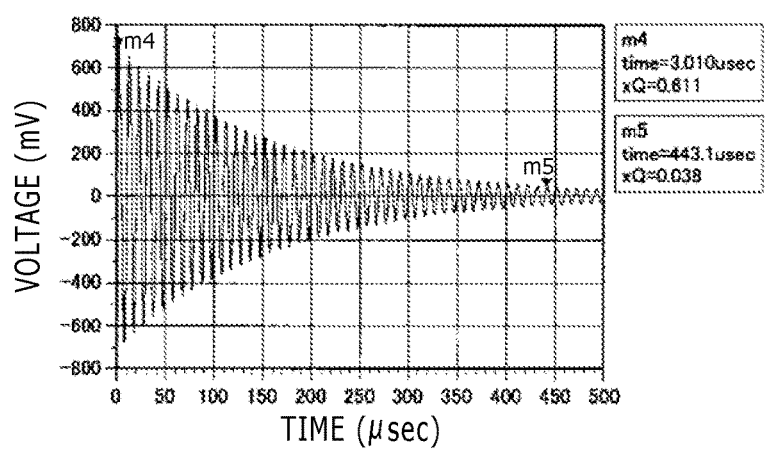
FIGS. 9A and 9B are a plurality of diagrams showing typical waveforms of a voltage appearing at the two terminals of a capacitor for a Q factor of 50 and a repetition period of 10 ms.
Figure 9B:
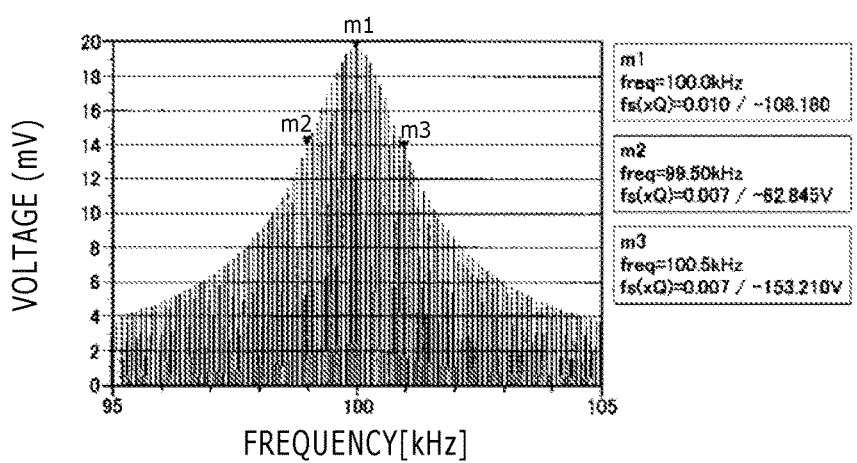

FIGS. 9A and 9B are a plurality of diagrams showing typical waveforms of a voltage appearing at the two terminals of the capacitor 32 for a Q factor of 50 and a repetition period of 10 ms. To be more specific, FIG. 9A is a diagram showing a time-domain response waveform whereas FIG. 9B is a diagram showing a frequency-domain response waveform.

On the assumption that no metallic foreign substance exists, the LC resonant circuit used in the analyses has a Q factor of 50 and the specification of the pulse applied to the circuit is the same as that for the case shown in FIGS. 8A and 8B.

As shown in FIG. 9A, after pulses have been applied to the LC resonant circuit, the time-domain voltages appearing at the two terminals of the capacitor 32 is attenuated faster than the case shown in FIG. 8A. In addition, as shown in FIG. 9B, the frequency-domain voltages appearing at the two terminals of the capacitor 32 have a peak at the resonance frequency and an amplitude which is gradually attenuated as the frequency deviates from the resonance frequency. However, the frequency-domain response waveform shown in FIG. 9B is not so sharp as the frequency-domain response waveform shown in FIG. 8B.

In accordance with the first embodiment described above, after pulses have been applied to the resonant circuit, the Q factor can be found with a high degree of accuracy from either the time-domain response waveform or the frequency-domain response waveform. Therefore, a metallic foreign substance can be detected with a high degree of precision. In addition, it is not necessary to provide a variable-frequency sinusoidal-signal generator having a good frequency resolution. That is to say, since a pulse generator for generating fixed pulse waves is adequate for the detection circuit to operate, the configuration of the detection circuit can be made simple.

In addition, if the resolution of the pulse wave in the frequency domain and the waveform fetching resolution in the frequency domain are sufficiently high, the precision of the pulse waveform is not required.

On top of that, repetitive works such as frequency sweeping are also not required. Thus, the measurement time is shortened substantially.

Moreover, the Q factor is measured from a voltage appearing at the two terminals of a reactance element, making it unnecessary to measure a small voltage applied to the entire resonant circuit. Thus, measurements can be carried out with a high degree of precision.

It is possible to provide a configuration allowing the processing to be carried out on the basis of both the time-domain response and the frequency-domain response and also allowing the time-domain response or the frequency-domain response to be properly selected on a case-by-case basis. In a typical configuration allowing the time-domain response or the frequency-domain response to be properly selected on a case-by-case basis, since the resonance frequency of a power receiving apparatus once set on a planar power supplying base is conceived to hardly change, the resonance frequency is found from the frequency-domain response only in the initial supplying of electric power. Then, in the subsequent supplying of electric power, only the Q factor is computed from the time-domain response.

By the way, the Q factor may be computed from the time-domain response as described above. In this case, the time-domain response waveform undesirably includes also a signal having a frequency other than the resonance frequency. As described above, however, the precision of the computed Q factor is high. This is because the filtering of the resonant circuit itself conceivably makes the resonance-frequency component dominant.

3: Second Embodiment

A second embodiment implements typical application of the detection circuit 10 according to the first embodiment to a power receiving apparatus.

Figure 10:
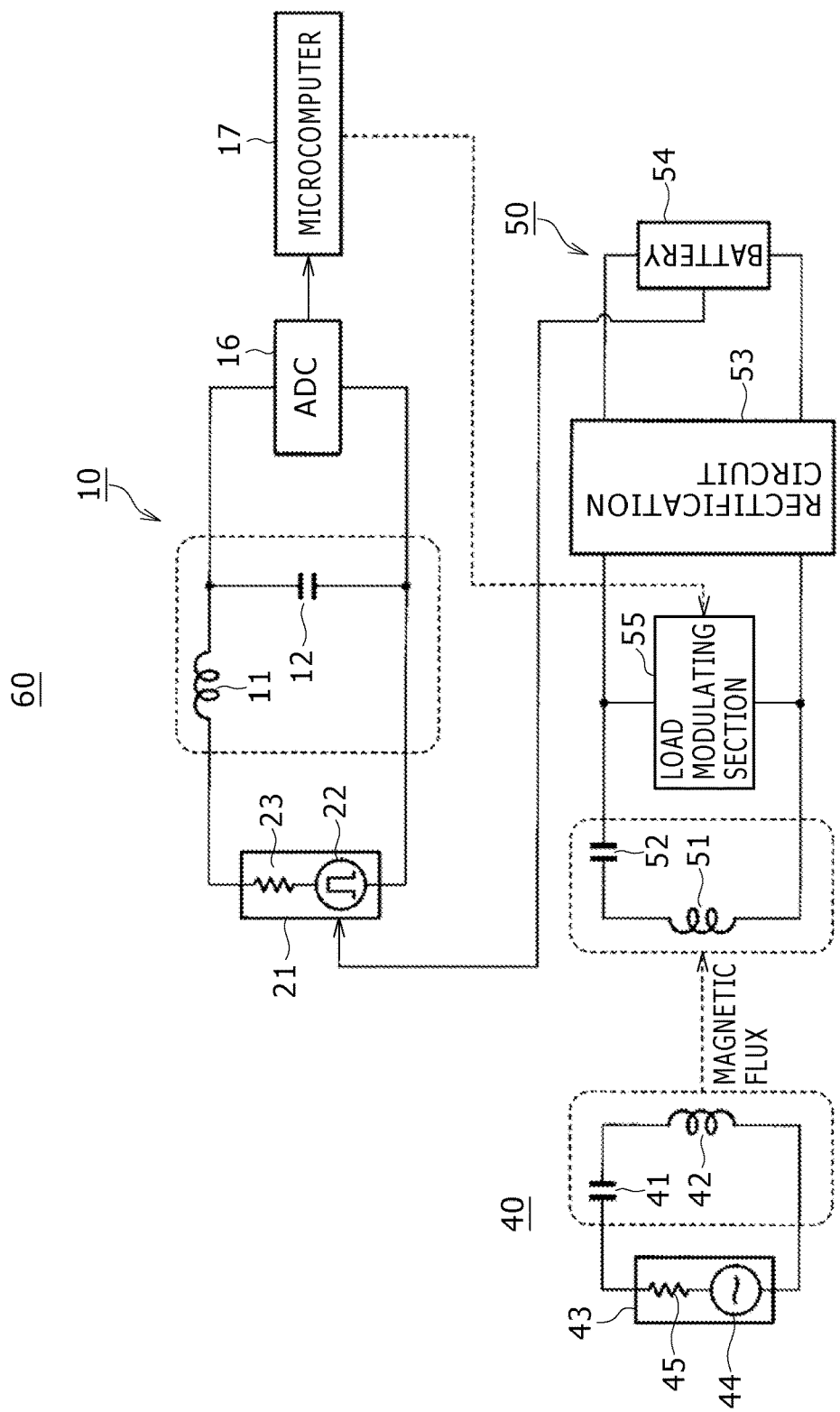
FIG. 10 is a circuit diagram roughly showing a power receiving apparatus provided by a second embodiment of the present disclosure to serve as a typical apparatus to which the detection circuit is applied.

FIG. 10 is a circuit diagram roughly showing a typical non-contact power transmission system including a power receiving apparatus 60 provided by the second embodiment of the present disclosure to serve as an apparatus to which the detection circuit 10 is applied. In FIG. 10, an element having a function and a configuration which are essentially identical with those of its counterpart shown in FIG. 3 is denoted by the same reference numeral as the counterpart. In addition, detailed explanation of each identical element is omitted.

As shown in FIG. 10, the non-contact power transmission system according to the second embodiment is configured to include a power transmitting apparatus 40 and the power receiving apparatus 60 which also has the function of the detection circuit 10. That is to say, the power receiving apparatus 60 includes a power receiving circuit 50 and the detection circuit 10 shown in FIG. 3. As described before, the detection circuit 10 detects a metallic foreign substance by measuring the Q factor of the detection resonant circuit employed in the detection circuit 10.

As shown in FIG. 10, the power transmitting apparatus 40 includes a signal source 43, a capacitor 41 and a power transmitting coil 42 which is also referred to as a primary-side coil. The signal source 43 includes a resistor 45 and a sinusoidal-power generator 44 for generating electric power having a sinusoidal waveform. The resistor 45 included in the signal source 43 represents the internal resistance of the sinusoidal-power generator 44 or the output impedance of the sinusoidal-power generator 44.

In this embodiment, the capacitor 41 and the power transmitting coil 42 are connected in series to the signal source 43 so that the capacitor 41 and the power transmitting coil 42 form an apparatus series resonant circuit. In addition, the capacitance of the capacitor 41 and the inductance of the power transmitting coil 42 are adjusted so that the apparatus series resonant circuit resonates at a resonance frequency at which electric power is to be transmitted to the power receiving circuit 50. Also referred to as an electrostatic capacitance, the capacitance of the capacitor 41 is also called a C value in the following description. On the other hand, the inductance of the power transmitting coil 42 is also referred to as an L value in the following description. The signal source 43 and the capacitor 41 are included in a power transmitting section of the power transmitting apparatus 40. The power transmitting section transmits electric power to an external destination such as the power receiving apparatus 60 by way of the power transmitting coil 42 through radio transmission or non-contact transmission.

As described above, the power receiving apparatus 60 has two functions, that is, the function of the power receiving circuit 50 and the function of the detection circuit 10. The power receiving circuit 50 serving as a typical power receiving section receives the electric power transmitted by the power transmitting apparatus 40 by non-contact transmission. On the other hand, the detection circuit 10 serving as a typical detection section detects a metallic foreign substance existing between the power receiving apparatus 60 and the power transmitting apparatus 40.

The power receiving circuit 50 includes a power receiving coil 51 also referred to as a secondary-side coil, a capacitor 52, a rectification circuit 53 and a battery 54 which is also referred to as a secondary-side battery. The power receiving coil 51 and the capacitor 52 form an apparatus series resonant circuit. The rectification circuit 53 rectifies AC electric power into DC electric power. In addition to the rectification, the rectification circuit 53 may also be configured to smooth the DC electric power obtained as a result of the rectification. The battery 54 supplies electric power to a variety of sections included in the power receiving apparatus 60. The battery 54 supplies electric power to mainly the signal source 21 which employs the pulse generator 22. In FIG. 10, the connection between the battery 54 and the signal source 21 is shown as a solid line. However, connections between the battery 54 and the other sections included in the power receiving apparatus 60 are not shown.

As described above, the power receiving circuit 50 includes a load adjusting section 55. The load adjusting section 55 is connected in parallel to the apparatus resonant circuit consisting of the power receiving coil 51 and the capacitor 52 which are connected to each other in series. A typical load adjusting section 55 includes a load and a switch which are connected to each other in series. A typical example of the load is a resistor. In accordance with control executed by the control section 17D employed in the microcomputer 17, the switch is turned on and off in order to connect the load to the power receiving circuit 50 and disconnect the load from the power receiving circuit 50. In this way, the state of electromagnetic coupling between the power transmitting apparatus 40 and the power receiving apparatus 60 can be changed and information on this state is transmitted to the power transmitting apparatus 40. In general, the switch is a switching device such as a transistor or a MOSFET (metal-oxide semiconductor field-effect transistor).

In the power receiving circuit 50 according to this embodiment, the power receiving coil 51 and the capacitor 52 are connected to each other in series to form an apparatus series resonant circuit. In addition, the C value and the L value are adjusted so that the apparatus series resonant circuit resonates at a resonance frequency. As described above, the C value is the capacitance of the capacitor 52 whereas the L value is the inductance of the power receiving coil 51.

If the determination section 17B employed in the microcomputer 17 as shown in FIG. 4 determines that a metallic foreign substance exists between the power receiving apparatus 60 and the power transmitting apparatus 40 as evidenced by a result of a measurement which is carried out by the detection circuit 10 of the power receiving apparatus 60 with the configuration described above to measure the Q factor, the control section 17D employed in the microcomputer 17 executes control to stop the transmission of electric power from the power transmitting apparatus 40 to the power receiving apparatus 60. That is to say, the control section 17D employed in the microcomputer 17 controls an operation carried out by the load adjusting section 55 to transmit a stop signal, which is used for stopping the transmission of electric power from the power transmitting apparatus 40 to the power receiving apparatus 60, from the power receiving apparatus 60 to the power transmitting apparatus 40 by way of the power receiving coil 51. In accordance with this stop signal received from the power receiving apparatus 60, a control section employed in the power transmitting apparatus 40 executes control to stop the sinusoidal-power generator 44. It is to be noted that this control section itself is not shown in the figure.

As described above, the detection circuit 10 is employed in the power receiving apparatus 60. It is to be noted, however, that the detection circuit 10 can also be applied to the power transmitting apparatus 40. In either case, if the detection circuit 10 detects a metallic foreign substance existing between the power transmitting apparatus and the power receiving apparatus, transmission of electric power from the power transmitting apparatus to the power receiving apparatus is stopped.

4: Third Embodiment

In the case of the first and second embodiments, in order to compute the Q factor from a time-domain response waveform, the ADC 16 carries out signal processing to find the envelop line of a voltage signal appearing on the reactance device of the resonant circuit. However, separate hardware serving as an envelop-line detecting circuit can be used to carry out the transformation of the voltage signal appearing on the reactance device of the resonant circuit into the envelop line.

Figure 11:
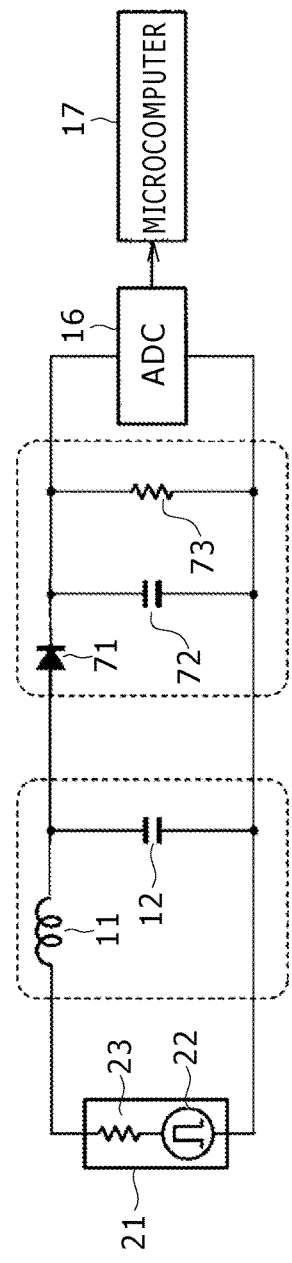
FIG. 11 is a diagram roughly showing a typical detection circuit according to a third embodiment of the present disclosure.

FIG. 11 is a diagram roughly showing a typical detection circuit 70 according to a third embodiment of the present disclosure. In FIG. 11, an element having a function and a configuration which are essentially identical with those of its counterpart shown in FIG. 3 is denoted by the same reference numeral as the counterpart. In addition, detailed explanation of each identical element is omitted.

The detection circuit 70 according to this embodiment is configured to have the separate hardware serving as an envelop-line detecting circuit between the capacitor 12 of the detection circuit 10 shown in FIG. 3 and the ADC 16. In FIG. 11, the envelop-line detecting circuit is shown as a dashed-line block on the right side. The envelop-line detecting circuit includes a diode 71, a capacitor 72 and a resistor 73. The diode 71 and the capacitor 72 are connected to each other in series whereas the series circuit consisting of the diode 71 and the capacitor 72 is connected to the two terminals of the capacitor 12 in parallel. In addition, the resistor 73 is connected to the capacitor 72 in parallel and connected to the ADC 16 also in parallel.

If the detection of the envelop line is carried out by such separate hardware as is the case with the third embodiment, measurements and processing which are carried out at a later stage become very simple. In this case, it is no longer necessary for the ADC 16 to carry out processing to compute an envelop line from a voltage signal appearing on the reactance device of the resonant circuit. That is to say, it is necessary to merely measure voltages at two times.

5: Fourth Embodiment

If the detection of an envelop line is carried out by such hardware, measurements and processing which are carried out at a later stage become very simple. However, time-related information is still required by the microcomputer 17 for computation of the Q factor. For example, information such as the resonance frequency and amplitudes measured at two measurement times is necessary. In this case, the amplitudes at two measurement times are amplitudes measured from the time-domain response waveform.

By the way, in order to find the resonance frequency by measurement, it is possible to adopt a technique for finding the resonance frequency by computing a vibration count representing the number of vibrations. To put it concretely, the resonance frequency is typically found from the time period of each of vibrations, the number of which is the vibration count defined as the number of vibrations in a prescribed time interval. This processing to find the resonance frequency is relatively simple processing. However, it is necessary to separately provide a channel or a circuit or to prepare a channel detouring the envelop-line detection circuit described above as follows.

Figure 12:
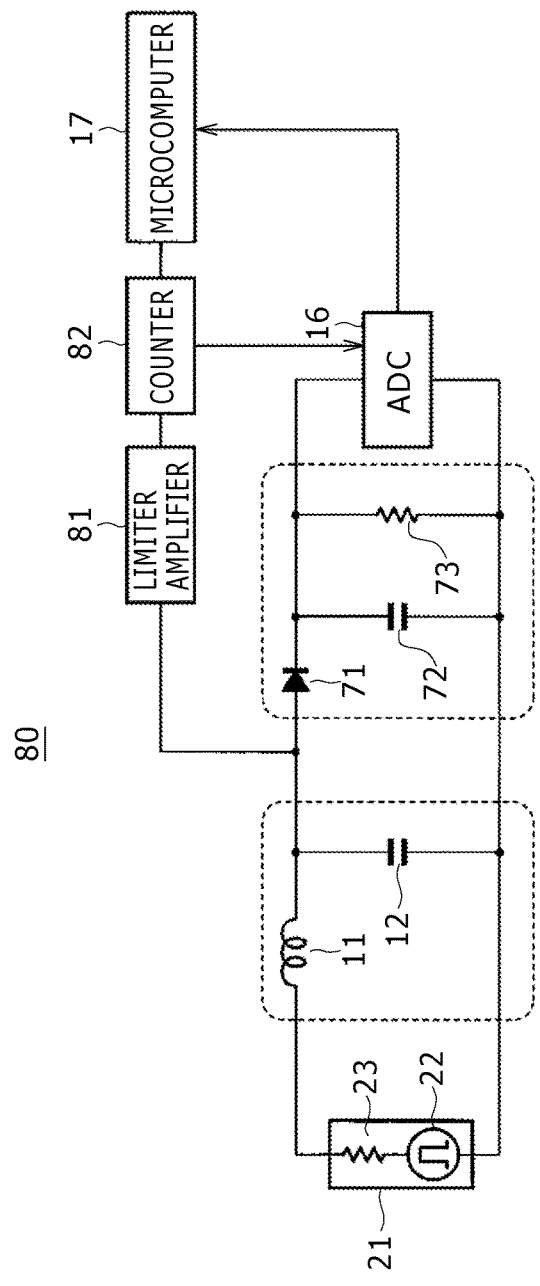
FIG. 12 is a diagram roughly showing a typical detection circuit according to a fourth embodiment of the present disclosure.

FIG. 12 is a diagram roughly showing a typical detection circuit 80 according to a fourth embodiment of the present disclosure. In FIG. 12, an element having a function and a configuration which are essentially identical with those of its counterpart shown in FIG. 11 is denoted by the same reference numeral as the counterpart. In addition, detailed explanation of each identical element is omitted.

In comparison with the detection circuit 70 shown in FIG. 11, the detection circuit 80 shown in FIG. 12 has a limiter amplifier 81 and a counter 82.

A signal having a varying amplitude is supplied to the limiter amplifier 81 from a node between the resonant circuit and the envelope-line detecting circuit. The limiter amplifier 81 is a waveform forming section for amplifying the input signal supplied thereto to a signal having a constant amplitude.

The counter 82 finds the vibration count of the constant-amplitude signal received from the limiter amplifier 81 and supplies the vibration count to the ADC 16 and the microcomputer 17. Thus, the ADC 16 is not required to provide the microcomputer 17 with information such as the time period of each of vibrations, the number of which is the vibration count defined as the number of vibrations in a prescribed time interval.

A computation formula is studied along with operations carried out by the detection circuit 80 as follows. Equation 3 can be changed to Equation 14 from which Equation 15 is eventually derived. In Equation 14, reference notation T denotes the time period of each of vibrations, the number of which is the vibration count. The vibration count is the number of vibrations in the time interval $(t_2-t_1)$. The time period T is the reciprocal of the resonance frequency f used in Equation 3. It is to be noted that, in Equations 14 and 15, reference notation $V_1$ denotes a voltage appearing at the beginning of the time interval $(t_2-t_1)$ whereas reference notation $V_2$ denotes a voltage appearing at the end of the time interval $(t_2-t_1)$. The beginning of the time interval $(t_2-t_1)$ is a time $t_1$ whereas the end of the time interval $(t_2-t_1)$ is a time $t_2$.

$$Q = \pi \cdot \frac{1}{T} \cdot \frac{t_2 - t_1}{ln\left(\frac{V_1}{V_2}\right)} = \pi \cdot \frac{1}{\frac{t_2-t_1}{\text{vibration-count}}} \cdot \frac{t_2 - t_1}{ln\left(\frac{V_1}{V_2}\right)} \quad \text{[Equation 14]}$$

$$Q = \frac{\pi \cdot \text{vibration-count}}{ln\left(\frac{V_1}{V_2}\right)} \quad \text{[Equation 15]}$$

As is obvious from Equation 15 serving as the computation formula, the Q factor can be computed from the vibration count found by the computation formula. That is to say, it is not necessary to compute the time period of a vibration. Thus, it is possible to further drastically reduce the load of the signal processing carried out by the ADC 16.

6: Fifth Embodiment

In a fifth embodiment, the Q factor is measured when the second amplitude (second voltage) $V_2$ of the time-domain response waveform is still within a predetermined range of amplitudes not including the first amplitude (first voltage) $V_1$ of the time-domain response waveform.

The Q factor is found from Equation 15 by making use of the vibration count. Due to a quantization error generated by the ADC 16, however, the time-domain response waveform may be attenuated excessively so that the second voltage $V_2$ undesirably has a magnitude close to 0. As a result, the Q factor cannot be computed correctly. This is because, even if the prescribed value of the vibration count changes, the voltage $V_2$ remains at 0 ($V_2=0$) as it is.

In addition, if the time-domain response waveform is attenuated too little, that is, if $V_1 \approx V_2$, the quantization error generated by the ADC 16 is also big. In order to solve these problems, the Q-factor measuring section 17A employed in the microcomputer 17 measures the Q factor when the second amplitude representing the voltage $V_2$ of the time-domain response waveform is still within a predetermined range of amplitudes not including the first amplitude representing the voltage $V_1$ of the time-domain response waveform.

As an example, if the Q factor is computed when the voltage $V_2$ is still in a range of about 40% to 25% of the voltage $V_1$, the error of the Q factor is small in some cases. Thus, if precision is desired, the Q-factor measurement algorithm is set so that the Q factor is computed when the voltage $V_2$ becomes equal to a threshold value smaller than such a range.

In accordance with the fifth embodiment, the quantization error generated by the ADC 16 can be reduced so that the Q factor can be found with a high degree of accuracy. Thus, the precision of detection of a metallic foreign substance can be improved.

7: Sixth Embodiment

In addition, in the case of a high Q factor, it takes too much time for the second amplitude of the time-domain response waveform to attain the threshold value set in accordance with the fifth embodiment. In such a case, it is nice to measure the Q factor on the basis of a time limit or the vibration count limit in place of such a threshold value. That is to say, if the second voltage $V_2$ of the time-domain response waveform had not entered the predetermined range of amplitudes not including the first voltage $V_1$ of the time-domain response waveform within a predetermined time period, the second voltage $V_2$ is detected and the Q factor is found at a point of time at which a time period determined in advance lapses.

In accordance with the sixth embodiment, the time it takes to measure the Q factor can be reduced to a limit not exceeding a time period determined in advance.

8: Others

In the first to fifth embodiments, it is also possible to provide the resonant circuit with a single pulse or a stand-alone pulse in place of a plurality of pulses. In comparison with a single pulse, however, a plurality of pulses offer a merit that the signal level of the frequency-domain response is high because much energy is supplied to the resonant circuit. Nevertheless, a single pulse also allows the Q factor to be measured.

In addition, in the first to fifth embodiments, the signal fetching time of the ADC 16 may be long in comparison with the desired measurement time. In such a case, two ADCs can be used to operate concurrently in order to solve the problem caused by the long signal fetching time.

On top of that, in the first to fifth embodiments, pulses are supplied to the resonant circuit employed in the detection circuit included in the power transmitting or receiving apparatus from a signal source embedded in the detection circuit through a wire. However, the pulses can also be supplied to the power transmitting or receiving apparatus from an external apparatus through magnetic coupling. Then, the power transmitting or receiving apparatus makes use of the pulses to measure the Q factor.

In the non-contact power transmission system shown in FIG. 10 for example, pulses can be supplied from the power transmitting apparatus 40 to the power receiving apparatus 60 through magnetic coupling. In this case, in accordance with the pulses, the power transmitting coil 42 employed in the power transmitting apparatus 40 outputs a magnetic flux to the Q-factor measurement coil 11 employed in the detection circuit 10 of the power receiving apparatus 60 through the magnetic coupling and a response to the magnetic flux is read out to measure the Q factor.

The detection circuit 10 employed in the first to fifth embodiments can also be applied to a non-contact power transmission system adopting an electromagnetic resonance method or a non-contact power transmission system adopting an electromagnetic induction method. In the following description, the detection circuit 10 is also referred to as a detection apparatus.

It is to be noted that the present disclosure can also be realized into the following implementations:

(1) A detection apparatus including:
 a resonant circuit provided with a Q-factor measurement coil and one or more capacitors to serve as a circuit for receiving pulses;
 a response-waveform detecting section configured to detect the waveform of a response output by the resonant circuit in response to the pulses; and
 a Q-factor measuring section configured to measure a Q factor of the resonant circuit from the response waveform detected by the response-waveform detecting section.

(2) The detection apparatus according to implementation (1), wherein the response waveform detected by the response-waveform detecting section is a time-domain response waveform.

(3) The detection apparatus according to implementation (2), wherein the Q-factor measuring section measures the Q factor of the resonant circuit from a first amplitude obtained from the time-domain response waveform at a first time and a second amplitude obtained from the time-domain response waveform at a second time lagging behind the first time by a time period determined in advance.

(4) The detection apparatus according to implementation (3), wherein, when the resonance frequency of the resonant circuit is denoted by f, the first amplitude obtained from the time-domain response waveform at the first time $t_1$ is denoted by $V_1$, and the second amplitude obtained from the time-domain response waveform at the second time $t_2$ is denoted by $V_2$, the Q-factor measuring section measures the Q factor in accordance with the following equation:

$$Q=\pi f(t_2-t_1)/\ln(V_1/V_2)$$

(5) The detection apparatus according to implementation (4), wherein the Q-factor measuring section measures the Q factor when the second amplitude obtained from the time-domain response waveform is in a predetermined amplitude range not including the first amplitude.

(6) The detection apparatus according to implementation (4), wherein, if the second amplitude obtained from the time-domain response waveform has not entered a predetermined amplitude range not including the first amplitude within a predetermined time period, the Q-factor measuring section measures the Q factor by detecting the second amplitude at a point of time after the lapse of the predetermined time period.

(7) The detection apparatus according to implementation (5) or (6), wherein the predetermined amplitude range set for the second amplitude obtained from the time-domain response waveform is a range of 40% to 25% of the first amplitude obtained from the time-domain response waveform.

(8) The detection apparatus according to implementation (2), wherein, when the number of vibrations occurring within a predetermined time period of the time-domain response waveform is denoted by "vibration-count," an amplitude obtained at the start of the predetermined time period is denoted by $V_1$, and an amplitude obtained at the end of the predetermined time period is denoted by $V_2$, the Q-factor measuring section measures the Q factor in accordance with the following equation:

$$Q=\pi \cdot \text{vibration-count}/\ln(V_1/V_2)$$

(9) The detection apparatus according to any one of implementations (1) to (8), further including
 a determination section configured to determine a state of electromagnetic coupling between the Q-factor measurement coil and an external apparatus by comparing the Q factor measured by the Q-factor measuring section with a predetermined reference value.

(10) The detection apparatus according to implementation (9), wherein the state of electromagnetic coupling between the Q-factor measurement coil and the external apparatus implies existence/non-existence of a circuit including any coil or a conductor between the Q-factor measurement coil and the external apparatus.

(11) The detection apparatus according to implementation (1), wherein the response waveform detected by the response-waveform detecting section is a frequency-domain response waveform.

(12) The detection apparatus according to implementation (11), wherein the Q-factor measuring section measures the Q factor from a bandwidth between two frequencies at each of which the amplitude of the frequency-domain response waveform is $1/\sqrt{2}$ times an amplitude at a resonance frequency of a series resonant circuit, the series resonant circuit including one or more the capacitors and the Q-factor measurement coil.

(13) The detection apparatus according to implementation (11), wherein the Q-factor measuring section measures the Q factor from a bandwidth between two frequencies at each of which the amplitude of the frequency-domain response waveform is $\sqrt{2}$ times an amplitude at a resonance frequency of a parallel resonant circuit, the parallel resonant circuit including one or more the capacitors and the Q-factor measurement coil.

(14) The detection apparatus according to any one of implementations (1) to (13), wherein the pulses applied to the resonant circuit are a single pulse.

(15) The detection apparatus according to any one of implementations (1) to (14), further including
a pulse generator configured to generate the pulses and apply the pulses to the resonant circuit.

(16) The detection apparatus according to implementation (10), further including
a control section configured to execute control to stop output of a power transmission signal from the external apparatus in case it is determined that a circuit including any coil or a conductor exists between the Q-factor measurement coil and the external apparatus.

(17) A power receiving apparatus including:
a power receiving coil electromagnetically coupled to an external apparatus;
a power receiving section configured to receive electric power from the external apparatus through the power receiving coil;
a resonant circuit provided with a Q-factor measurement coil and one or more capacitors to serve as a circuit for receiving pulses;
a response-waveform detecting section configured to detect the waveform of a response output by the resonant circuit in response to the pulses; and
a Q-factor measuring section configured to measure a Q factor of the resonant circuit from the response waveform detected by the response-waveform detecting section.

(18) A power transmission system including:
a power transmitting apparatus configured to transmit electric power by adoption of a non-contact transmission technique; and
a power receiving apparatus configured to receive the electric power from the power transmitting apparatus,
wherein the power receiving apparatus includes
a power receiving coil electromagnetically coupled to a power transmitting coil of the power transmitting apparatus,
a power receiving section configured to receive electric power from the power transmitting apparatus through the power receiving coil,
a resonant circuit provided with a Q-factor measurement coil and one or more capacitors to serve as a circuit for receiving pulses,
a response-waveform detecting section configured to detect the waveform of a response output by the resonant circuit in response to the pulses, and
a Q-factor measuring section configured to measure a Q factor of the resonant circuit from the response waveform detected by the response-waveform detecting section.

(19) A detection method including:
applying pulses to a resonant circuit provided with a Q-factor measurement coil and one or more capacitors;
driving a response-waveform detecting section to detect the waveform of a response output by the resonant circuit in response to the pulses; and
driving a Q-factor measuring section to measure a Q factor of the resonant circuit from the response waveform detected by the response-waveform detecting section.

It is to be noted that the sequence of processes in the embodiments described above can be carried out by hardware or by execution of software. If the sequence of processes is carried out by execution of software, programs composing the software can be executed by a computer embedded in dedicated hardware or a computer in which the programs have been installed for the purpose of performing a variety of functions. For example, it is nice to make use of a general personal computer or the like for executing programs installed therein as programs composing desired software.

In addition, the apparatus and the system may be provided with a recording medium used for recording codes of the programs composing the software to be executed to carry out functions of the embodiments. On top of that, it is needless to say that the functions can be carried out by the computer included in the apparatus or the system by reading out the program codes from the recording medium. In place of the computer, a control apparatus such as a CPU may be used.

Typical examples of the recording medium used for recording the codes of the programs include a flexible disk, a hard disk, an optical disk, a magneto optical disk, a CD-ROM (compact disk read only memory), a CD-R (compact disk recordable), a magnetic tape, a nonvolatile card and a ROM, to mention a few.

In addition, the computer executes the program codes read out from the recording medium in order to carry out the functions of the embodiments described above. On top of that, on the basis of instructions expressed by the program codes, typically, an OS operating on the computer carries out part or all of actual processing. By carrying out the processing, it is also possible to implement the functions of the embodiments described above in some cases.

In addition, in this specification, steps of time-series processing can of course be carried out in a prescribed order along the time axis. However, the processing steps do not have to be carried out in a prescribed order along the time axis. That is to say, the processing steps may also include processes to be carried out concurrently or independently of each other, for example, steps of concurrent processing or steps of object-based processing.

Realizations of the present disclosure are by no means limited to the embodiments described so far and the implementations explained above. That is to say, the present disclosure can of course be implemented into a variety of other typical modified versions and can of course be applied to a variety of typical applications as long as the modified versions and the applications do not depart from the scope described in the claims.

That is to say, the embodiments described above are no more than preferred typical implementations. Thus, a variety of technologically desired restrictions are imposed on the embodiments. However, the technological range of the present disclosure is by no means limited to these embodiments unless otherwise particularly stated in any description that a restriction is imposed on the present disclosure. For example, each material mentioned in the description, the quantity of the material, the processing time, the processing order and the numerical condition of each parameter are no more than preferred typical ones. In addition, dimensions in the figures referred to in the description, the shape of each of the figures and positional relations in each of the figures are approximate ones.

The present disclosure contains subject matter related to that disclosed in Japanese Priority Patent Application JP 2011-280059 filed in the Japan Patent Office on Dec. 21, 2011, the entire content of which is hereby incorporated by reference.

What is claimed is:

1. An apparatus comprising:
    a resonant circuit including a coil and one or more capacitors;
    a signal source configured to generate a signal that is input into the resonant circuit;
    a Q-factor measuring section configured to (a) measure a first voltage at a first terminal of the coil when the signal-source signal is input into the resonant circuit, and (b) obtain a Q-factor of the coil using the measurement of the first voltage; and
    a determination section configured to determine whether or not a foreign object exists in close vicinity of the coil by comparing the Q-factor obtained by the Q-factor measuring section with a predetermined reference value.

2. The apparatus of claim 1, wherein the signal-source comprises:
    a pulse generator with circuitry to generate signal pulses; and
    a resistor to generate the signal based on the signal pulses.

3. The apparatus of claim 1, further comprising a control section operative to stop transmission of electric power by a power transmitter to a power receiver in response to detection of a foreign object in the close vicinity of the coil.

4. The apparatus of claim 1, wherein the frequency of the signal is equal to a resonance frequency of the resonant circuit.

5. The power transmitting apparatus of claim 4, wherein the frequency of the signal is equal to a resonance frequency of the resonant circuit.

6. The power transmitting apparatus of claim 4 configured to obtain the Q-factor of the coil before power transmission occurs.

7. The power transmitting apparatus of claim 4, configured to determine the existence of a foreign object in the close vicinity of the coil when the Q-factor obtained by the Q-factor measuring section is lower than the predetermined reference value.

8. The apparatus of claim 1, wherein the Q-factor measuring section is configured to measure the first voltage twice, and obtain the Q-factor using the two measurements of the first voltage.

9. The apparatus of claim 8, wherein the Q-factor measuring section is configured to measure the first voltage at a first time and at a second time lagging behind the first time by a predetermined time period.

10. The apparatus of claim 8, wherein the Q-factor measuring section is configured to obtain the Q-factor using Equation 3:

$$Q = \pi f \cdot \frac{t_2 - t_1}{\ln\left(\frac{V_1}{V_2}\right)}$$

where, f is a resonance frequency of the resonant circuit, V1 is the first measurement of the first voltage at a point in time t1, and V2 is the second measurement of the first voltage a point in time t2.

11. The apparatus of claim 8, wherein the Q-factor measuring section is configured to measure the first voltage at a second time when the first voltage is in a predetermined range including the first voltage at a first time.

12. The apparatus of claim 11, wherein the predetermined range set for the first voltage at the second time is a range of 40% to 25% of the first voltage at the first time.

13. The apparatus of claim 8, wherein, the Q-factor measuring section is configured to measure the first voltage again at a second point of time after the lapse of a determined time period as when the first voltage has not entered a predetermined range not including the first voltage at a first point in time within the predetermined time period.

14. The apparatus of claim 13, wherein the predetermined range set for the first voltage at the second point in time is only in a range of 40% to 25% of the first voltage at the first point in time.

15. The apparatus of claim 8, wherein the Q-factor measuring section is configured to obtain the Q-factor using Equation 15:

$$Q = \frac{\pi \cdot \text{vibration} - \text{count}}{\ln\left(\frac{V_1}{V_2}\right)}$$

where, V1 is the first measurement of the first voltage at a point in time t1, V2 is the second measurement of the first voltage a point in time t2, and vibration-count is a count of vibrations in a constant-amplitude signal related to the first voltage.

16. The apparatus of claim 1, wherein the Q-factor measuring section is configured to measure a second voltage at a second terminal of the coil when the signal-source signal is input into the resonant circuit, and obtain the Q-factor using the measurements of the measurements of the first voltage and the second voltage.

17. A power transmitting apparatus comprising:
    a resonant circuit including a coil and one or more capacitors;
    a signal-source configured to input a signal to the resonant circuit;
    a Q-factor measuring section configured to measure a first voltage at a first terminal of the coil and a second voltage at a second terminal of the coil when the signal-source signal is input into the resonant circuit, and to obtain a Q-factor of the coil using the first voltage and the second voltage;
    a determination section configured to determine whether or not a foreign object exists in close vicinity of the coil by comparing the Q-factor obtained by the Q-factor measuring section with a predetermined reference value; and
    a power transmitting section configured to transmit electric power wirelessly to a power receiving apparatus.

18. The power transmitting apparatus of claim 17, wherein the signal-source comprises:
    a pulse generator with circuitry to generate signal pulses; and
    a resistor to generate the signal based on the signal pulses.

19. The power transmitting apparatus of claim 17, further comprising a control section operative to stop transmission of electric power by the power transmitter to the power receiver in response to detection of a foreign object in the close vicinity of the coil.

20. A method comprising:
    providing a resonant circuit including (a) a coil and one or more capacitors, (b) a signal-source configured to generate a signal that is input into the resonant circuit, (c) a Q-factor measuring section configured to (1) measure a first voltage at a first terminal of the coil when the signal-source signal is input into the resonant circuit, and (2) obtain a Q-factor of the coil using the measurement of the first voltage, and (c) a determination section configured to determine whether or not a foreign object exists in close vicinity of the coil by comparing the Q-factor obtained by the Q-factor measuring section with a predetermined reference value;

inputting the signal-source signal into the resonant circuit;

measuring the first voltage at the first terminal;

obtaining a Q-factor of the coil using the measurement of the first voltage; and determining whether or not a foreign object exists in close vicinity of the coil by comparing the Q-factor obtained by the Q-factor measuring section with a predetermined reference value.

21. A power transmitting apparatus comprising:

providing a resonant circuit including (a) a coil and one or more capacitors, (b) a signal-source configured to input a signal to the resonant circuit, (c) a Q-factor measuring section configured to measure a first voltage at a first terminal of the coil and measure a second voltage at a second terminal of the coil when the signal-source signal is input into the resonant circuit, and to obtain a Q-factor of the coil using the first voltage and the second voltage, (d) a determination section configured to determine whether or not a foreign object exists in close vicinity of the coil by comparing the Q-factor obtained by the Q-factor measuring section with a predetermined reference value, and (e) a power transmitting section configured to transmit electric power wirelessly to a power receiving apparatus;

inputting the signal-source signal into the resonant circuit;

measuring the first voltage at the first terminal;

measuring the second voltage at the second terminal;

obtaining a Q-factor of the coil using the measurement of the first voltage and the measurement of the second voltage; and determining whether or not a foreign object exists in close vicinity of the coil by comparing the Q-factor obtained by the Q-factor measuring section with a predetermined reference value.

* * * * *